United States Patent
Chang

(10) Patent No.: US 10,924,112 B2
(45) Date of Patent: Feb. 16, 2021

(54) BANDGAP REFERENCE CIRCUIT

(71) Applicant: eMemory Technology Inc., Hsin-Chu (TW)

(72) Inventor: Chia-Fu Chang, Hsinchu County (TW)

(73) Assignee: EMEMORY TECHNOLOGY INC., Hsin-Chu (TW)

(*) Notice: Subject to any disclaimer, the term of this patent is extended or adjusted under 35 U.S.C. 154(b) by 0 days.

(21) Appl. No.: 16/741,791

(22) Filed: Jan. 14, 2020

(65) Prior Publication Data

US 2020/0326742 A1 Oct. 15, 2020

Related U.S. Application Data

(60) Provisional application No. 62/832,853, filed on Apr. 11, 2019.

(51) Int. Cl.
| | |
|---|---|
| G05F 3/26 | (2006.01) |
| H03K 19/00 | (2006.01) |
| H03K 17/16 | (2006.01) |
| H03K 19/0185 | (2006.01) |
| H03K 3/356 | (2006.01) |
| H03K 19/0944 | (2006.01) |
| H02M 3/07 | (2006.01) |
| H03K 17/687 | (2006.01) |
| G11C 5/02 | (2006.01) |
| G11C 11/16 | (2006.01) |

(Continued)

(52) U.S. Cl.
CPC ......... *H03K 19/0013* (2013.01); *G05F 3/262* (2013.01); *G11C 5/025* (2013.01); *G11C 7/06* (2013.01); *G11C 7/1051* (2013.01); *G11C 7/1084* (2013.01); *G11C 11/1673* (2013.01); *G11C 11/1675* (2013.01); *G11C 11/1697* (2013.01); *G11C 16/08* (2013.01); *G11C 16/14* (2013.01); *G11C 16/16* (2013.01); *G11C 16/24* (2013.01); *G11C 16/26* (2013.01); *H02M 3/07* (2013.01); *H03K 3/356* (2013.01); *H03K 17/162* (2013.01); *H03K 17/6871* (2013.01);

(Continued)

(58) Field of Classification Search
CPC ............................ G05F 3/26–267; G05F 3/30
See application file for complete search history.

(56) References Cited

U.S. PATENT DOCUMENTS

| | | | |
|---|---|---|---|
| 6,677,808 B1* | 1/2004 | Sean | G05F 3/30 323/313 |
| 7,236,048 B1* | 6/2007 | Holloway | G05F 3/30 327/512 |

(Continued)

FOREIGN PATENT DOCUMENTS

CN 101840243 A 9/2010

*Primary Examiner* — Fred E Finch, III
(74) *Attorney, Agent, or Firm* — WPAT, PC

(57) ABSTRACT

A bandgap reference circuit is applied to the wide range supply voltage. When a power supply voltage is changed, the change amount of the bandgap voltage generated by the bandgap reference circuit is very low. The bandgap reference circuit includes a mirroring circuit, an input circuit and an operation amplifier. The mirroring circuit generates a first current, a second current and a third current to a first node, a second node and an output voltage of the bandgap reference circuit. The input circuit is connected with the first node to receive the first current and connected with the second node to receive the second current. A positive input terminal of the operation amplifier is connected with the first node. A negative input terminal of the operation amplifier is connected with the second node. An output terminal of the operation amplifier is connected with the mirroring circuit.

12 Claims, 5 Drawing Sheets

(51) Int. Cl.
- *G11C 7/06* (2006.01)
- *G11C 7/10* (2006.01)
- *G11C 16/08* (2006.01)
- *G11C 16/14* (2006.01)
- *G11C 16/24* (2006.01)
- *G11C 16/26* (2006.01)
- *G11C 16/16* (2006.01)

(52) U.S. Cl.
CPC . *H03K 19/018528* (2013.01); *H03K 19/0944* (2013.01); *G05F 3/267* (2013.01)

(56) References Cited

U.S. PATENT DOCUMENTS

| | | | | |
|---|---|---|---|---|
| 2005/0012493 A1* | 1/2005 | Rosenthal | ............... | G05F 3/30 323/313 |
| 2009/0184752 A1* | 7/2009 | Kudo | ............... | G05F 3/30 327/535 |
| 2009/0267585 A1* | 10/2009 | Liu | ............... | H03F 3/45085 323/313 |
| 2011/0227636 A1* | 9/2011 | Endo | ............... | G05F 3/30 327/541 |
| 2013/0241632 A1* | 9/2013 | Inoue | ............... | G05F 3/02 327/537 |
| 2013/0249527 A1* | 9/2013 | Arnold | ............... | G05F 3/16 323/314 |
| 2014/0035665 A1* | 2/2014 | Nicollini | ............... | H03F 3/45264 327/552 |
| 2015/0185754 A1* | 7/2015 | Liu | ............... | G05F 3/267 323/313 |
| 2019/0072994 A1* | 3/2019 | Ippolito | ............... | G05F 3/267 |
| 2019/0147825 A1* | 5/2019 | Tsuchi | ............... | G09G 3/3614 345/209 |

* cited by examiner

BANDGAP REFERENCE CIRCUIT

This application claims the benefit of U.S. provisional application Ser. No. 62/832,853, filed Apr. 11, 2019, the subject matter of which is incorporated herein by reference.

FIELD OF THE INVENTION

The present invention relates to a circuit, and more particularly to a bandgap reference circuit.

BACKGROUND OF THE INVENTION

FIG. 1 is a schematic circuit diagram illustrating a conventional bandgap reference circuit. As shown in FIG. 1, the conventional bandgap reference circuit 100 comprises a mirroring circuit 12, an operation amplifier 15 and an input circuit 20.

The mirroring circuit 12 comprises three p-type metal-oxide semiconductor (PMOS) transistors M1, M2 and M3. The three PMOS transistors M1, M2 and M3 have the same aspect ratio (W/L). The gate terminals of the PMOS transistors M1, M2 and M3 are connected with each other. The source terminals of the PMOS transistors M1, M2 and M3 receive a power supply voltage Vdd. The drain terminals of the PMOS transistors M1, M2 and M3 issue the output currents Ix, Iy and Iz, respectively.

An output terminal O of the operation amplifier 15 is connected with the gate terminals of the PMOS transistors M1, M2 and M3. A negative input terminal of the operation amplifier 15 is connected with the drain terminal of the PMOS transistor M2. A positive input terminal of the operation amplifier 15 is connected with the drain terminal of the PMOS transistor M1.

The input circuit 20 comprises two bipolar junction transistors (hereinafter referred as BJT transistors) Q1 and Q2 and a resistor R1. The layout area of the BJT transistor Q1 is m times the layout area of the BJT transistor Q2. The bases and the collectors of the BJT transistors Q1 and Q2 are connected with a ground terminal. Consequently, the BJT transistors Q1 and Q2 have a diode-connected structure. The emitter of the BJT transistor Q2 is connected with the positive input terminal of the operation amplifier 15. Moreover, the resistor R1 is connected between the emitter of the BJT transistor Q1 and the negative input terminal of the operation amplifier 15.

The layout area of a BJT transistor Q3 is equal to the layout area of the BJT transistor Q2. The base and the collector of the BJT transistor Q3 are connected with the ground terminal. A resistor R2 is connected with the emitter of the BJT transistor Q3 and the drain terminal of the PMOS transistor M3. Moreover, a bandgap voltage $V_{BG}$ is outputted from the drain terminal of the PMOS transistor M3.

Please refer to FIG. 1 again. Since the PMOS transistors M1, M2 and M3 have the same aspect ratio (W/L), the magnitudes of the output currents Ix, Iy and Iz from the drain terminals of the PMOS transistors M1, M2 and M3 are equal. That is, the relationships between the output currents Ix, Iy and Iz may be expressed by the following formula (1):

$$Ix=Iy=Iz \quad (1)$$

In case that the operation amplifier 15 has an infinite gain, the negative input voltage Vy and the positive input voltage Vx of the operation amplifier 15 are equal. Consequently, the following formula (2) is obtained.

$$R1 \times Iy + V_{EB1} = V_{EB2} \quad (2)$$

In the formula (2), $V_{EB1}$ is the voltage across the emitter and the base of the BJT transistor Q1 and $V_{EB2}$ is the voltage across the emitter and the base of the BJT transistor Q2.

As mentioned above, the BJT transistors Q1 and Q2 have the diode-connected structure, and the layout area of the BJT transistor Q1 is m times the layout area of the BJT transistor Q2. Consequently, the relationships between the Ix, Iy, $V_{EB1}$ and $V_{EB2}$ may be expressed by the following formulae:

$$Ix = I_s e^{\frac{V_{EB2}}{V_T}} \text{ and } Iy = mI_s e^{\frac{V_{EB1}}{V_T}}$$

Consequently, the following formulae (3) and (4) are obtained.

$$V_{BE1} = V_T \times \ln(Iy/m \times Is) \quad (3)$$

$$V_{BE2} = V_T \times \ln(Ix/Is) \quad (4)$$

In the above formulae, Is is the saturation current of the BJT transistor Q2, and $V_T$ is a thermal voltage.

According to the formulae (1), (2), (3) and (4), the following formulae (5) and (6) are obtained.

$$Iy = (1/R1) \times V_T \times \ln m \quad (5)$$

$$V_{BG} = (R2/R1) \times V_T \times \ln m + V_{EB3} \quad (6)$$

In the above formulae, $V_{EB3}$ is the voltage across the emitter and the base of the BJT transistor Q3.

Generally, if the power supply voltage Vdd provided to the bandgap reference circuit is changed to a large extent, the bandgap voltage $V_{GB}$ generated by the bandgap reference circuit is subjected to a change. For example, if the power supply voltage Vdd is changed from 1.75V to 5.75V, the bandgap voltage $V_{GB}$ generated by the bandgap reference circuit 100 has a change percentage of about 3% to 4%.

SUMMARY OF THE INVENTION

An embodiment of the present invention provides a bandgap reference circuit. The bandgap reference circuit includes a mirroring circuit, an input circuit and an operation amplifier. The mirroring circuit generates a first current, a second current and a third current. The first current flows to a first node. The second current flows to a second node. The third current flows to an output terminal of the bandgap reference circuit. The input circuit is connected with the first node to receive the first current and connected with the second node to receive the second current. A positive input terminal of the operation amplifier is connected with the first node. A negative input terminal of the operation amplifier is connected with the second node. An output terminal of the operation amplifier is connected with the mirroring circuit. The operation amplifier includes a first PMOS transistor, a second PMOS transistor, a first NMOS transistor, a second NMOS transistor, a third PMOS transistor, a fourth PMOS transistor, a third NMOS transistor, a fourth NMOS transistor, a fifth NMOS transistor, a sixth NMOS transistor and a reference current source. A source terminal of the first PMOS transistor receives a power supply voltage. A gate terminal of the first PMOS transistor receives a first bias voltage. A source terminal of the second PMOS transistor is connected with a drain terminal of the first PMOS transistor. A gate terminal of the second PMOS transistor receives a second bias voltage. A drain terminal of the first NMOS transistor is connected with a drain terminal of the second PMOS transistor. A gate terminal of the first NMOS transistor receives a third bias voltage. A drain terminal of the second NMOS transistor is connected with a source terminal of the first NMOS transistor. A gate terminal of the second NMOS transistor is connected with the drain terminal of the second PMOS transistor. A source terminal of the second NMOS transistor is connected with a ground terminal. A source terminal of the third PMOS transistor receives the power supply voltage. A gate terminal of the third PMOS transistor receives the first bias voltage. A source terminal of the fourth PMOS transistor is connected with a drain terminal of the third PMOS transistor. A gate terminal of the fourth PMOS transistor receives the second bias voltage. A drain terminal of the fourth PMOS transistor is the output terminal of the operation amplifier. A drain terminal of the third NMOS transistor is connected with a drain terminal of the fourth PMOS transistor. A gate terminal of the third NMOS transistor receives the third bias voltage. A drain terminal of the fourth NMOS transistor is connected with a source terminal of the third NMOS transistor. A gate terminal of the fourth NMOS transistor is connected with the gate terminal of the second NMOS transistor. A source terminal of the fourth NMOS transistor is connected with the ground terminal. A drain terminal of the fifth NMOS transistor is connected with the drain terminal of the first PMOS transistor. A gate terminal of the fifth NMOS transistor is the positive input terminal of the operation amplifier. A drain terminal of the sixth NMOS transistor is connected with a drain terminal of the third PMOS transistor. A gate terminal of the sixth NMOS transistor is the negative input terminal of the operation amplifier. A first terminal of the reference current source is connected with a source terminal of the fifth NMOS transistor and a source terminal of the sixth NMOS transistor. A second terminal of the reference current source is connected with the ground terminal.

Another embodiment of the present invention provides a bandgap reference circuit. The bandgap reference circuit includes a mirroring circuit, an input circuit and an operation amplifier. The mirroring circuit generates a first current, a second current and a third current. The first current flows to a first node. The second current flows to a second node. The third current flows to an output terminal of the bandgap reference circuit. The input circuit is connected with the first node to receive the first current and connected with the second node to receive the second current. A positive input terminal of the operation amplifier is connected with the first node. A negative input terminal of the operation amplifier is connected with the second node. An output terminal of the operation amplifier is connected with the mirroring circuit. The operation amplifier includes a first PMOS transistor, a second PMOS transistor, a first NMOS transistor, a second NMOS transistor, a third PMOS transistor, a fourth PMOS transistor, a third NMOS transistor, a fourth NMOS transistor, a fifth NMOS transistor, a sixth NMOS transistor and a reference current source. A source terminal of the first PMOS transistor receives a power supply voltage. A source terminal of the second PMOS transistor is connected with a drain terminal of the first PMOS transistor. A gate terminal of the second PMOS transistor receives a first bias voltage. A drain terminal of the first NMOS transistor is connected with a drain terminal of the second PMOS transistor and a gate terminal of the first PMOS transistor. A gate terminal of the first NMOS transistor receives a second bias voltage. A drain terminal of the second NMOS transistor is connected with a source terminal of the first NMOS transistor. A gate terminal of the second NMOS transistor receives a third bias voltage. A source terminal of the second NMOS transistor is connected with a ground terminal. A source terminal of the third PMOS transistor receives the power supply voltage. A gate terminal of the third PMOS transistor is connected with the gate terminal of the first PMOS transistor. A source terminal of the fourth PMOS transistor is connected with a drain terminal of the third PMOS transistor. A gate terminal of the fourth PMOS transistor receives the first bias voltage. A drain terminal of the fourth PMOS transistor is the output terminal of the operation amplifier. A drain terminal of the third NMOS transistor is connected with the drain terminal of the fourth PMOS transistor. A gate terminal of the third NMOS transistor receives the second bias voltage. A drain terminal of the fourth NMOS transistor is connected with a source terminal of the third NMOS transistor. A gate terminal of the fourth NMOS transistor receives the third bias voltage. A source terminal of the fourth NMOS transistor is connected with the ground terminal. A drain terminal of the fifth NMOS transistor is connected with the drain terminal of the first PMOS transistor. A gate terminal of the fifth NMOS transistor is the positive input terminal of the operation amplifier. A drain terminal of the sixth NMOS transistor is connected with the drain terminal of the third PMOS transistor. A gate terminal of the sixth NMOS transistor is the negative input terminal of the operation amplifier. A first terminal of the reference current source is connected with a source terminal of the fifth NMOS transistor and a source terminal of the sixth NMOS transistor. A second terminal of the reference current source is connected with the ground terminal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
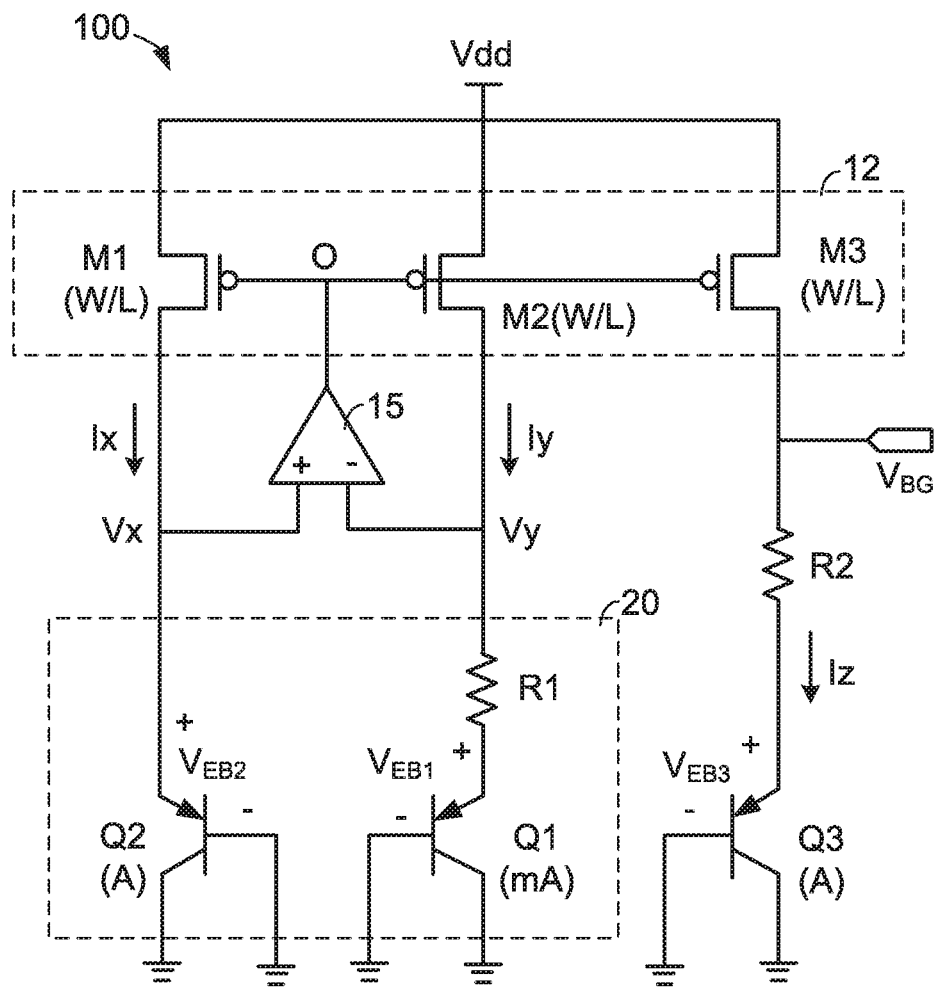
FIG. 1 (prior art) is a schematic circuit diagram illustrating a conventional bandgap reference circuit.
Figure 2:
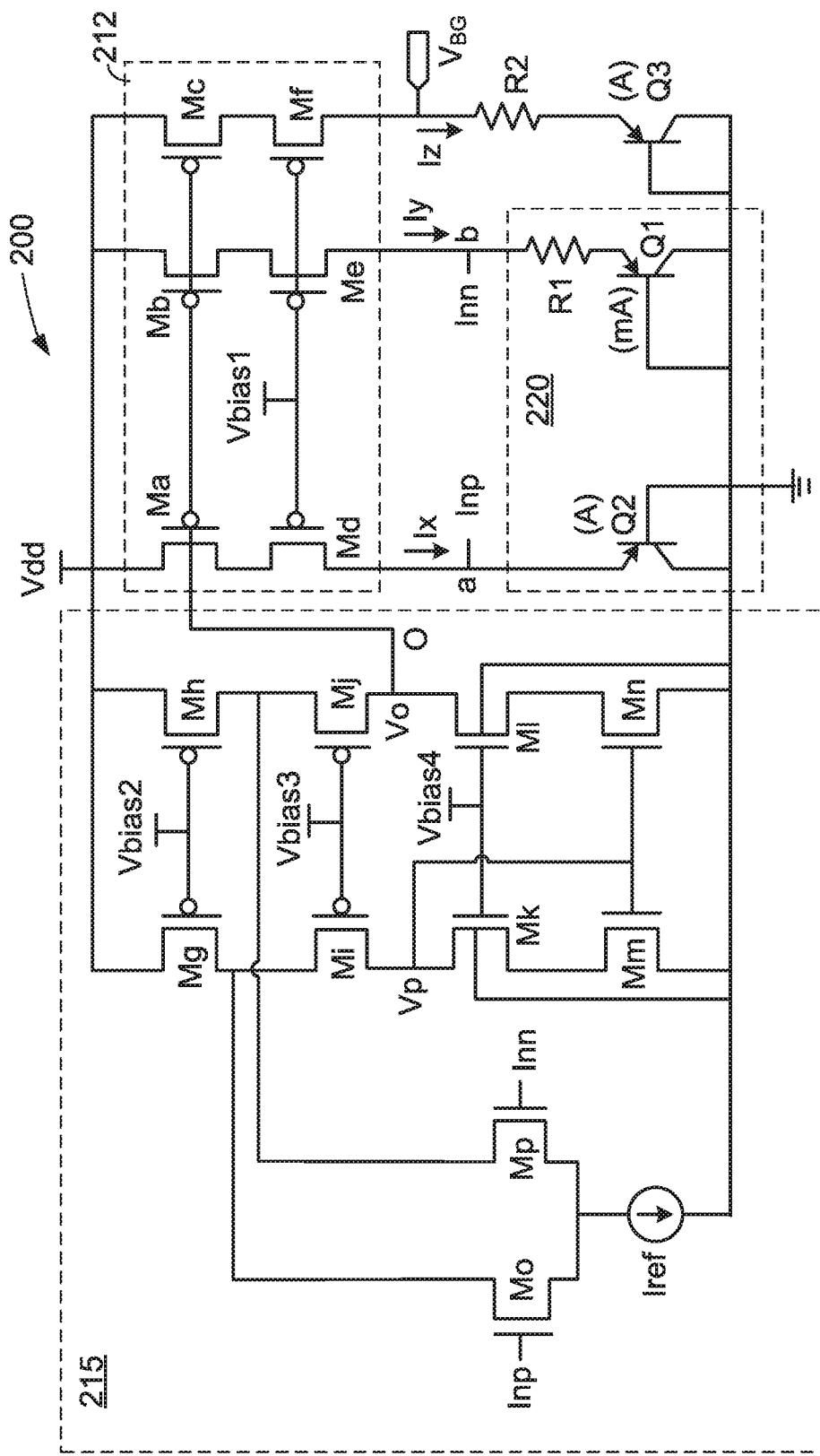
FIG. 2 is a schematic circuit diagram illustrating a bandgap reference circuit according to a first embodiment of the present invention.

FIG. 2 is a schematic circuit diagram illustrating a bandgap reference circuit according to a first embodiment of the present invention. As shown in FIG. 2, the bandgap reference circuit 200 comprises a mirroring circuit 212, an operation amplifier 215 and an input circuit 220.

The mirroring circuit 212 comprises six p-type metal-oxide semiconductor (PMOS) transistors Ma, Mb, Mc, Md, Me and Mf. The six PMOS transistors Ma, Mb, Mc, Md, Me and Mf have the same aspect ratio (W/L). It is noted that the aspect ratios of the PMOS transistors Ma, Mb, Mc, Md, Me and Mf may be varied according to the practical requirements.

The gate terminals of the PMOS transistors Ma, Mb and Mc are connected with each other. The source terminals of the PMOS transistors Ma, Mb and Mc receive a power supply voltage Vdd. The drain terminals of the PMOS transistors Ma, Mb and Mc are connected with the source terminals of the PMOS transistors Md, Me and Mf. The gate terminals of the PMOS transistors Md, Me and Mf receive a bias voltage Vbias1. The drain terminals of the PMOS transistors Md, Me and Mf are connected with a node "a", a node "b" and an output terminal of the bandgap reference circuit 200, respectively. Moreover, the drain terminals of the PMOS transistors Md, Me and Mf issue the output currents Ix, Iy and Iz, respectively.

A negative input terminal Inn of the operation amplifier 215 is connected with the node "b". A positive input terminal Inp of the operation amplifier 215 is connected with the drain terminal of the node "a". An output terminal O of the operation amplifier 215 is connected with the gate terminals of the PMOS transistors Ma, Mb and Mc.

The input circuit 220 comprises two BJT transistors Q1 and Q2 and a resistor R1. The layout area of the BJT transistor Q1 is m times the layout area of the BJT transistor Q2.

The bases and the collectors of the BJT transistors Q1 and Q2 are connected with a ground terminal. Consequently, the BJT transistors Q1 and Q2 have a diode-connected structure. The emitter of the BJT transistor Q2 is connected with the node "a". Moreover, the resistor R1 is connected between the emitter of the BJT transistor Q1 and the node "b".

The layout area of a BJT transistor Q3 is equal to the layout area of the BJT transistor Q2. The base and the collector of the BJT transistor Q3 are connected with the ground terminal. A resistor R2 is connected with the emitter of the BJT transistor Q3 and the drain terminal of the PMOS transistor Mf. Moreover, a bandgap voltage $V_{BG}$ is outputted from the drain terminal of the PMOS transistor Mf. It is noted that the areas of the BJT transistors Q1, Q2 and Q3 may be varied according to the practical requirements.

In this embodiment, the operation amplifier 215 comprises four PMOS transistors Mg, Mh, Mi and Mj, six n-type metal-oxide semiconductor (NMOS) transistors Mk, Ml, Mm, Mn, Mo and Mp and a reference current source Iref.

The source terminal of the PMOS transistor Mg receives the power supply voltage Vdd. The gate terminal of the PMOS transistor Mg receives a bias voltage Vbias2. The source terminal of the PMOS transistor Mi is connected with the drain terminal of the PMOS transistor Mg. The gate terminal of the PMOS transistor Mi receives a bias voltage Vbias3. The source terminal of the NMOS transistor Mm is connected with the ground terminal. The gate terminal of the NMOS transistor Mm is connected with the drain terminal of the PMOS transistor Mi. The source terminal of the NMOS transistor Mk is connected with the drain terminal of the NMOS transistor Mm. The gate terminal of the NMOS transistor Mk receives a bias voltage Vbias4. The drain terminal of the NMOS transistor Mk is connected with the drain terminal of the PMOS transistor Mi. The body terminal of the NMOS transistor Mk is connected with the ground terminal.

The source terminal of the PMOS transistor Mh receives the power supply voltage Vdd. The gate terminal of the PMOS transistor Mh receives the bias voltage Vbias2. The source terminal of the PMOS transistor Mj is connected with the drain terminal of the PMOS transistor Mh. The gate terminal of the PMOS transistor Mj receives the bias voltage Vbias3. The drain terminal of the PMOS transistor Mj is used as the output terminal O of the operation amplifier 215. The source terminal of the NMOS transistor Mn is connected with the ground terminal. The gate terminal of the NMOS transistor Mn is connected with the gate terminal of the NMOS transistor Mm. The source terminal of the NMOS transistor Ml is connected with the drain terminal of the NMOS transistor Mn. The gate terminal of the NMOS transistor Ml receives the bias voltage Vbias4. The drain terminal of the NMOS transistor Ml is connected with the drain terminal of the PMOS transistor Mj. The body terminal of the NMOS transistor Ml is connected with the ground terminal.

The drain terminal of the NMOS transistor Mo is connected with the drain terminal of the PMOS transistor Mg. The gate terminal of the NMOS transistor Mo is used as a positive input terminal Inp of the operation amplifier 215. The source terminal of NMOS transistor Mo is connected with a first terminal of the reference current source Iref. The drain terminal of the NMOS transistor Mp is connected with the drain terminal of the PMOS transistor Mh. The gate terminal of the NMOS transistor Mp is used as a negative input terminal Inn of the operation amplifier 215. The source terminal of the NMOS transistor Mp is connected with the first terminal of the reference current source Iref. Moreover, a second terminal of the reference current source Iref is connected with the ground terminal.

When the bandgap reference circuit 200 is in the normal working state, the voltages at the negative input terminal Inn and the positive input terminal Inp of the operation amplifier 215 are equal. In addition, the magnitudes of the output currents Ix, Iy and Iz from the mirroring circuit 212 are equal. Consequently, the bandgap voltage $V_{BG}$ may be expressed by the following formula: $V_{BG}=(R2/R1) \times V_T \times Inm+V_{EB3}$. The method of deducing the above formula is not redundantly described herein.

The associated voltages of the bandgap reference circuit 200 will be described as follows.

In a situation, the power voltage Vdd is 5.75V. In the operation amplifier 215, the drain voltage Vo of the NMOS transistor Ml is about 4.84V, and the drain voltage Vp of the NMOS transistor Mk is about 0.7V.

Since the drain voltage Vo of the NMOS transistor Ml is about 4.84V, the NMOS transistor Ml generates a leakage current. The leakage current flows from the drain terminal of the NMOS transistor Ml to the ground terminal through the body terminal of the NMOS transistor Ml. The magnitude of the leakage current is about 374 nA. Since the drain voltage Vp of the NMOS transistor Mk is about 0.7V, NMOS transistor Mk generates a leakage current. The leakage current flows from the drain terminal of the NMOS transistor Mk to the ground terminal through the body terminal of the NMOS transistor Mk. The magnitude of the leakage current is about 5 pA.

In this example, the leakage current from the NMOS transistor Ml is about 75,000 times the leakage current from the NMOS transistor Mk. Since the difference between the leakage current from the NMOS transistor Ml and the leakage current from the NMOS transistor Mk is very huge, the bandgap voltage $V_{BG}$ generated by the bandgap reference circuit 200 is about 1.2795V.

In another situation, the power voltage Vdd is 1.75V. In the operation amplifier 215, the drain voltage Vo of the NMOS transistor Ml is about 0.85V, and the drain voltage Vp of the NMOS transistor Mk is about 0.7V. Since the difference between the leakage current from the NMOS transistor Ml and the leakage current from the NMOS transistor Mk is decreased, the bandgap voltage $V_{BG}$ generated by the bandgap reference circuit 200 is about 1.2545V.

When the power voltage Vdd is changed from 5.75V to 1.75V, the change amount of the bandgap voltage $V_{GB}$ generated by the bandgap reference circuit 200 is about 25 mV. That is, the bandgap voltage $V_{GB}$ has a change percentage of about 2%.

Figure 3:
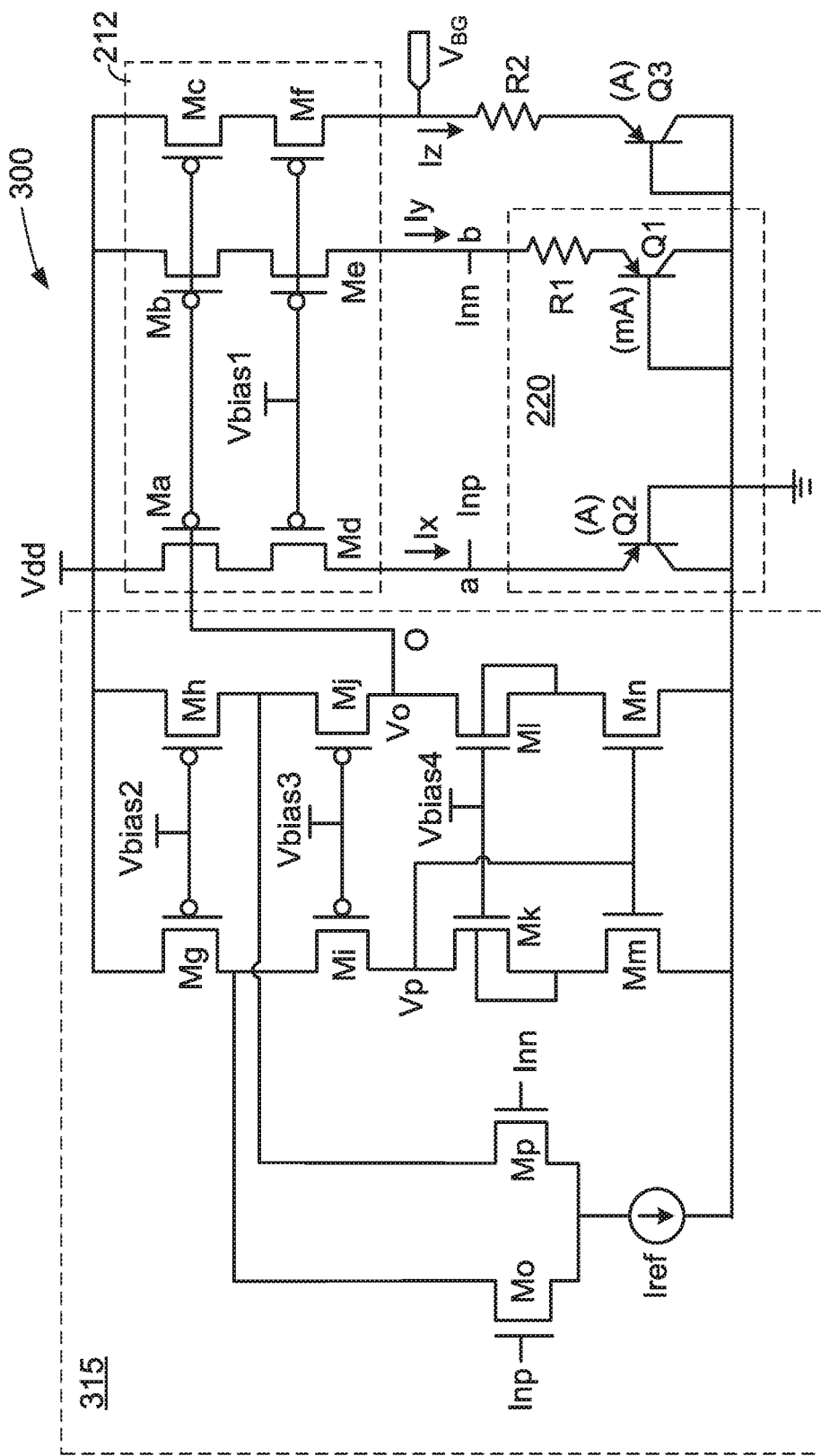
FIG. 3 is a schematic circuit diagram illustrating a bandgap reference circuit according to a second embodiment of the present invention.

FIG. 3 is a schematic circuit diagram illustrating a bandgap reference circuit according to a second embodiment of the present invention. As shown in FIG. 3, the bandgap reference circuit 300 comprises a mirroring circuit 212, an operation amplifier 315 and an input circuit 220.

In comparison with the bandgap reference circuit 200 of the first embodiment, the connecting relationships between the NMOS transistors Mk and Ml of the operation amplifier 315 in the bandgap reference circuit 300 of this embodiment are distinguished. For brevity, only the connecting relationships between the NMOS transistors Mk and Ml will be described as follows.

In the operation amplifier 315, the source terminal of the NMOS transistor Mk is connected with the drain terminal of the NMOS transistor Mm, the gate terminal of the NMOS transistor Mk receives a bias voltage Vbias4, the drain terminal of the NMOS transistor Mk is connected with the drain terminal of the PMOS transistor Mi, and the body terminal of the NMOS transistor Mk is connected with the source terminal of the NMOS transistor Mk. The source terminal of the NMOS transistor Ml is connected with the drain terminal of the NMOS transistor Mn. The gate terminal of the NMOS transistor Ml receives the bias voltage Vbias4. The drain terminal of the NMOS transistor Ml is connected with the drain terminal of the PMOS transistor Mj. The body terminal of the NMOS transistor Ml is connected with the source terminal of the NMOS transistor Ml.

In this embodiment, the body terminal and the source terminal of the NMOS transistor Mk are connected with each other, and the body terminal and the source terminal of the NMOS transistor Ml are connected with each other. Consequently, the leakage currents from the NMOS transistors Mk and Ml will not flow to the ground terminal. Instead, the leakage currents flow to the next-stage NMOS transistors Mm and Mn. Under this circumstance, the influences of the leakage currents of the NMOS transistors Mk and Ml on the bandgap voltage $V_{GB}$ will be largely reduced.

In a situation, the power voltage Vdd is 5.75V. In the operation amplifier 315, the drain voltage Vo of the NMOS transistor Ml is about 4.84V, and the drain voltage Vp of the NMOS transistor Mk is about 0.7V. Meanwhile, the bandgap voltage $V_{BG}$ generated by the bandgap reference circuit 300 is about 1.2593V.

In another situation, the power voltage Vdd is 1.75V. In the operation amplifier 315, the drain voltage Vo of the NMOS transistor Ml is about 0.85V, and the drain voltage Vp of the NMOS transistor Mk is about 0.7V. Meanwhile, the bandgap voltage $V_{BG}$ generated by the bandgap reference circuit 300 is about 1.2545V.

When the power voltage Vdd is changed from 5.75V to 1.75V, the change amount of the bandgap voltage $V_{GB}$ generated by the bandgap reference circuit 300 is about 4.8 mV. That is, the bandgap voltage $V_{GB}$ has a change percentage of about 0.383%.

Figure 4:
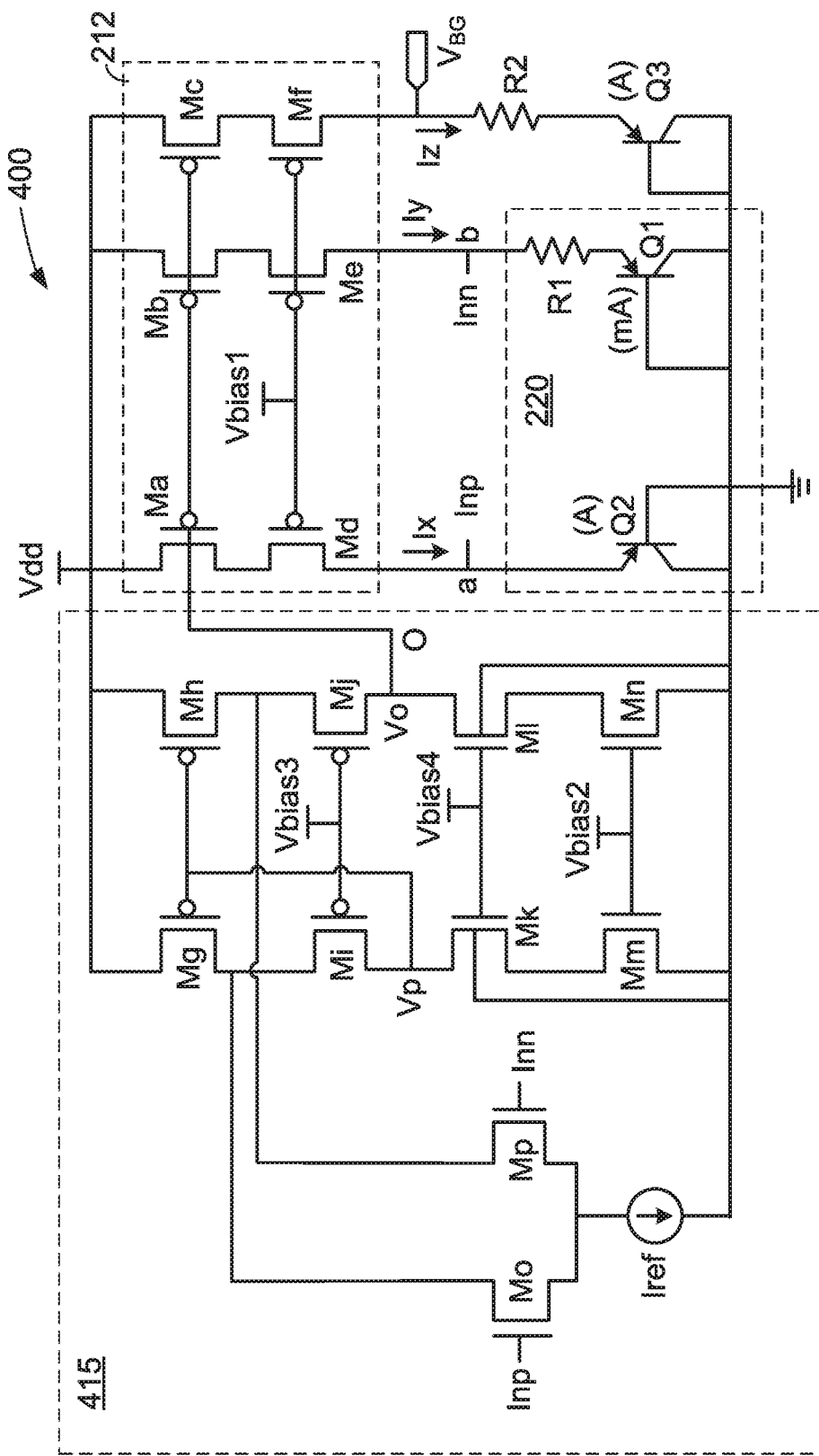
FIG. 4 is a schematic circuit diagram illustrating a bandgap reference circuit according to a third embodiment of the present invention.

FIG. 4 is a schematic circuit diagram illustrating a bandgap reference circuit according to a third embodiment of the present invention. As shown in FIG. 4, the bandgap reference circuit 400 comprises a mirroring circuit 212, an operation amplifier 415 and an input circuit 220.

In comparison with the bandgap reference circuit 200 of the first embodiment, the connecting relationships of the operation amplifier 415 in the bandgap reference circuit 400 of this embodiment are distinguished. For brevity, only the connecting relationships of the operation amplifier 415 will be described as follows.

In this embodiment, the operation amplifier 415 comprises four PMOS transistors Mg, Mh, Mi and Mj, six n-type metal-oxide semiconductor (NMOS) transistors Mk, Ml, Mm, Mn, Mo and Mp and a reference current source Iref.

The source terminal of the PMOS transistor Mg receives the power supply voltage Vdd. The source terminal of the PMOS transistor Mi is connected with the drain terminal of the PMOS transistor Mg. The gate terminal of the PMOS transistor Mi receives the bias voltage Vbias3. The source terminal of the NMOS transistor Mm is connected with the ground terminal. The gate terminal of the NMOS transistor Mm receives the bias voltage Vbias2. The source terminal of the NMOS transistor Mk is connected with the drain terminal of the NMOS transistor Mm. The gate terminal of the NMOS transistor Mk receives the bias voltage Vbias4. The drain terminal of the NMOS transistor Mk is connected with the drain terminal of the PMOS transistor Mi and the gate terminal of the PMOS transistor Mg. The body terminal of the NMOS transistor Mk is connected with the ground terminal.

The source terminal of the PMOS transistor Mh receives the power supply voltage Vdd. The gate terminal of the PMOS transistor Mh is connected with the gate terminal of the PMOS transistor Mg. The source terminal of the PMOS transistor Mj is connected with the drain terminal of the PMOS transistor Mh. The gate terminal of the PMOS transistor Mj receives the bias voltage Vbias3. The drain terminal of the PMOS transistor Mj is used as the output terminal O of the operation amplifier 415. The source terminal of the NMOS transistor Mn is connected with the ground terminal. The gate terminal of the NMOS transistor Mn receives the bias voltage Vbias2. The source terminal of the NMOS transistor Ml is connected with the drain terminal of the NMOS transistor Mn. The gate terminal of the NMOS transistor Ml receives the bias voltage Vbias4. The drain terminal of the NMOS transistor Ml is connected with the drain terminal of the PMOS transistor Mi. The body terminal of the NMOS transistor Ml is connected with the ground terminal.

The drain terminal of the NMOS transistor Mo is connected with the drain terminal of the PMOS transistor Mg. The gate terminal of the NMOS transistor Mo is used as a positive input terminal Inp of the operation amplifier 415. The source terminal of NMOS transistor Mo is connected with a first terminal of the reference current source Iref. The drain terminal of the NMOS transistor Mp is connected with the drain terminal of the PMOS transistor Mh. The gate terminal of the NMOS transistor Mp is used as a negative input terminal Inn of the operation amplifier 415. The source terminal of the NMOS transistor Mp is connected with the first terminal of the reference current source Iref. Moreover, a second terminal of the reference current source Iref is connected with the ground terminal.

In a situation, the power voltage Vdd is 5.75V. In the operation amplifier 415, the drain voltage Vo of the NMOS transistor Ml is about 4.84V, and the drain voltage Vp of the NMOS transistor Mk is about 4.74V. Since the drain voltage Vo of the NMOS transistor Ml is close to the drain voltage Vp of the NMOS transistor Mk, the leakage currents from the NMOS transistorS Ml and Mk are nearly equal. Meanwhile, the bandgap voltage $V_{BG}$ generated by the bandgap reference circuit 400 is about 1.2385V.

In another situation, the power voltage Vdd is 1.75V. In the operation amplifier 415, the drain voltage Vo of the NMOS transistor Ml is about 0.85V, and the drain voltage Vp of the NMOS transistor Mk is about 0.7V. Since the drain voltage Vo of the NMOS transistor Ml is close to the drain voltage Vp of the NMOS transistor Mk, the leakage currents from the NMOS transistorS Ml and Mk are nearly equal. Meanwhile, the bandgap voltage $V_{BG}$ generated by the bandgap reference circuit 400 is about 1.2378V.

When the power voltage Vdd is changed from 5.75V to 1.75V, the change amount of the bandgap voltage $V_{GB}$ generated by the bandgap reference circuit 400 is about 0.7 mV. That is, the bandgap voltage $V_{GB}$ has a change percentage of about 0.057%.

Moreover, the bandgap reference circuit of the third embodiment may be further modified.

Figure 5:
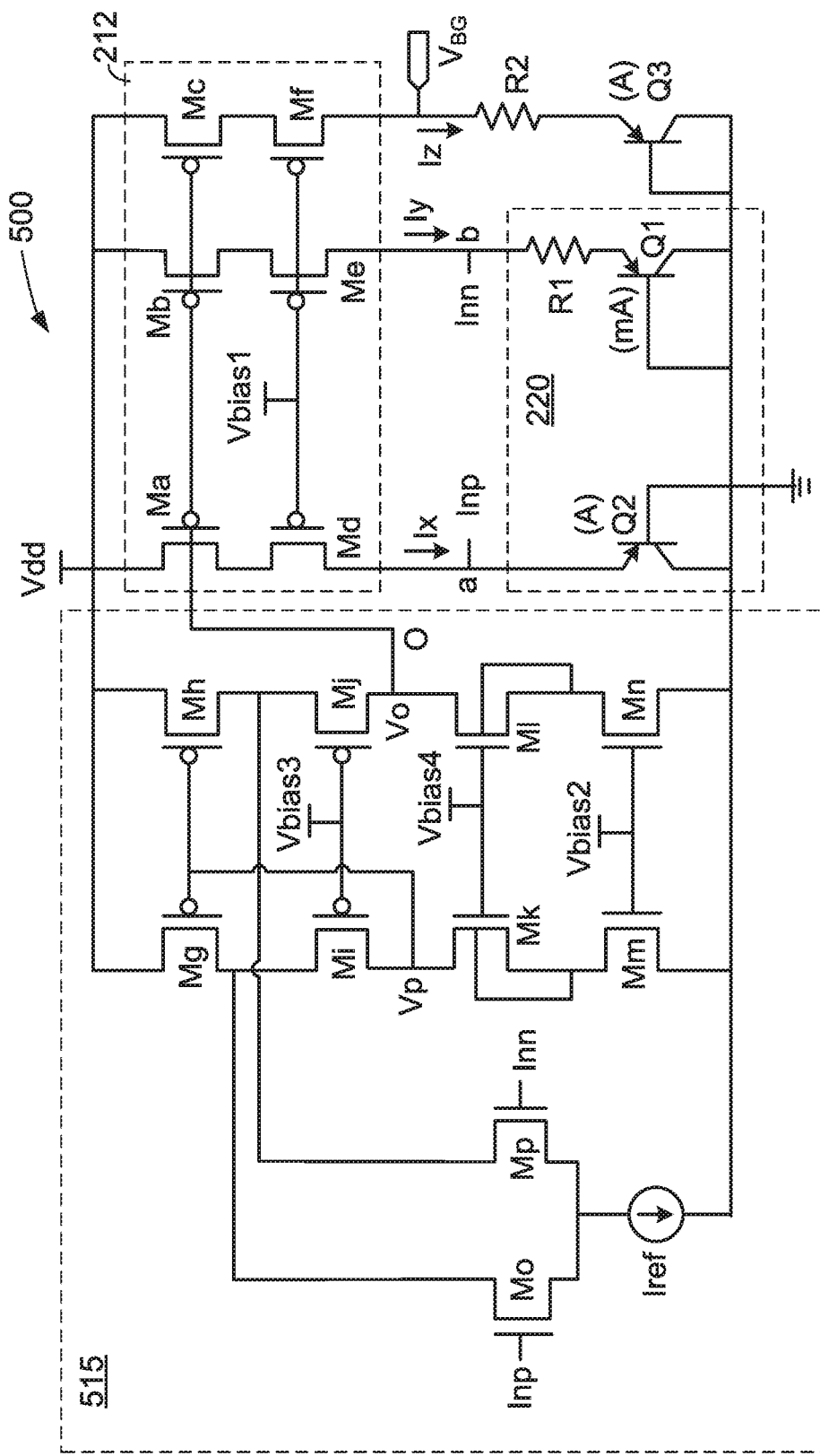
FIG. 5 is a schematic circuit diagram illustrating a bandgap reference circuit according to a fourth embodiment of the present invention.

FIG. 5 is a schematic circuit diagram illustrating a bandgap reference circuit according to a fourth embodiment of the present invention. As shown in FIG. 5, the bandgap reference circuit 500 comprises a mirroring circuit 212, an operation amplifier 515 and an input circuit 220.

In comparison with the bandgap reference circuit 400 of the third embodiment, the connecting relationships between the NMOS transistors Mk and Ml of the operation amplifier 515 in the bandgap reference circuit 500 of this embodiment are distinguished. For brevity, only the connecting relationships between the NMOS transistors Mk and Ml will be described as follows.

In the operation amplifier 515, the source terminal of the NMOS transistor Mk is connected with the drain terminal of the NMOS transistor Mm, the gate terminal of the NMOS transistor Mk receives a bias voltage Vbias4, the drain terminal of the NMOS transistor Mk is connected with the drain terminal of the PMOS transistor Mi, and the body terminal of the NMOS transistor Mk is connected with the source terminal of the NMOS transistor Mk. The source terminal of the NMOS transistor Ml is connected with the drain terminal of the NMOS transistor Mn. The gate terminal of the NMOS transistor Ml receives the bias voltage Vbias4. The drain terminal of the NMOS transistor Ml is connected with the drain terminal of the PMOS transistor Mj. The body terminal of the NMOS transistor Ml is connected with the source terminal of the NMOS transistor Ml.

When the power voltage Vdd is changed from 5.75V to 1.75V, the change amount of the bandgap voltage $V_{GB}$ generated by the bandgap reference circuit 500 is very low. That is, the change percentage of the bandgap voltage $V_{GB}$ is largely decreased.

From the above descriptions, the present invention provides a bandgap reference circuit that is applied to the wide range supply voltage. When the power supply voltage Vdd is changed, the change percentage of the bandgap voltage generated by the bandgap reference circuit is very low.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A bandgap reference circuit, comprising:
a mirroring circuit generating a first current, a second current and a third current, wherein the first current flows to a first node, the second current flows to a second node, and the third current flows to an output terminal of the bandgap reference circuit;
an input circuit connected with the first node to receive the first current and connected with the second node to receive the second current; and
an operation amplifier, wherein a positive input terminal of the operation amplifier is connected with the first node, a negative input terminal of the operation amplifier is connected with the second node, and an output terminal of the operation amplifier is connected with the mirroring circuit, wherein the operation amplifier comprises:
a first PMOS transistor, wherein a source terminal of the first PMOS transistor receives a power supply voltage, and a gate terminal of the first PMOS transistor receives a first bias voltage;
a second PMOS transistor, wherein a source terminal of the second PMOS transistor is connected with a drain terminal of the first PMOS transistor, and a gate terminal of the second PMOS transistor receives a second bias voltage;
a first NMOS transistor, wherein a drain terminal of the first NMOS transistor is connected with a drain terminal of the second PMOS transistor, and a gate terminal of the first NMOS transistor receives a third bias voltage;
a second NMOS transistor, wherein a drain terminal of the second NMOS transistor is connected with a source terminal of the first NMOS transistor, a gate terminal of the second NMOS transistor is connected with the drain terminal of the second PMOS transistor, and a source terminal of the second NMOS transistor is connected with a ground terminal;
a third PMOS transistor, wherein a source terminal of the third PMOS transistor receives the power supply voltage, and a gate terminal of the third PMOS transistor receives the first bias voltage;
a fourth PMOS transistor, wherein a source terminal of the fourth PMOS transistor is connected with a drain terminal of the third PMOS transistor, a gate terminal of the fourth PMOS transistor receives the second bias voltage, and a drain terminal of the fourth PMOS transistor is the output terminal of the operation amplifier;
a third NMOS transistor, wherein a drain terminal of the third NMOS transistor is connected with a drain terminal of the fourth PMOS transistor, and a gate terminal of the third NMOS transistor receives the third bias voltage;
a fourth NMOS transistor, wherein a drain terminal of the fourth NMOS transistor is connected with a source terminal of the third NMOS transistor, a gate terminal of the fourth NMOS transistor is connected with the gate terminal of the second NMOS transistor, and a source terminal of the fourth NMOS transistor is connected with the ground terminal;
a fifth NMOS transistor, wherein a drain terminal of the fifth NMOS transistor is connected with the drain terminal of the first PMOS transistor, and a gate terminal of the fifth NMOS transistor is the positive input terminal of the operation amplifier;
a sixth NMOS transistor, wherein a drain terminal of the sixth NMOS transistor is connected with a drain terminal of the third PMOS transistor, and a gate terminal of the sixth NMOS transistor is the negative input terminal of the operation amplifier; and
a reference current source, wherein a first terminal of the reference current source is connected with a source terminal of the fifth NMOS transistor and a source terminal of the sixth NMOS transistor, and a second terminal of the reference current source is connected with the ground terminal.

2. The bandgap reference circuit as claimed in claim 1, wherein the mirroring circuit comprises:
a fifth PMOS transistor, wherein a source terminal of the fifth PMOS transistor receives the power supply voltage, and a gate terminal of the fifth PMOS transistor is connected with the output terminal of the operation amplifier;
a sixth PMOS transistor, wherein a source terminal of the sixth PMOS transistor receives the power supply voltage, and a gate terminal of the sixth PMOS transistor is connected with the output terminal of the operation amplifier;
a seventh PMOS transistor, wherein a source terminal of the seventh PMOS transistor receives the power supply voltage, and a gate terminal of the seventh PMOS transistor is connected with the output terminal of the operation amplifier;
an eighth PMOS transistor, wherein a source terminal of the eighth PMOS transistor is connected with a drain terminal of the fifth PMOS transistor, a gate terminal of the eighth PMOS transistor receives a fourth bias voltage, and a drain terminal of the eighth PMOS transistor is connected with the first node;
a ninth PMOS transistor, wherein a source terminal of the ninth PMOS transistor is connected with a drain terminal of the sixth PMOS transistor, a gate terminal of the ninth PMOS transistor receives the fourth bias voltage, and a drain terminal of the ninth PMOS transistor is connected with the second node; and
a tenth PMOS transistor, wherein a source terminal of the tenth PMOS transistor is connected with a drain terminal of the seventh PMOS transistor, a gate terminal of the tenth PMOS transistor receives the fourth bias voltage, and a drain terminal of the tenth PMOS transistor is connected with the output terminal of the bandgap reference circuit.

3. The bandgap reference circuit as claimed in claim 2, wherein the input circuit comprises:
a first resistor;
a first bipolar junction transistor, wherein the first resistor is connected between an emitter of the first bipolar junction transistor and the second node, and a base and a collector of the first bipolar junction transistor are connected with the ground terminal; and
a second bipolar junction transistor, wherein an emitter of the second bipolar junction transistor is connected with the first node, and a base and a collector of the second bipolar junction transistor are connected with the ground terminal.

4. The bandgap reference circuit as claimed in claim 3, further comprising:
a second resistor, wherein a first terminal of the second resistor is connected with the output terminal of the bandgap reference circuit; and
a third bipolar junction transistor, wherein an emitter of the third bipolar junction transistor is connected with a second terminal of the second resistor, and a base and a collector of the third bipolar junction transistor are connected with the ground terminal.

5. The bandgap reference circuit as claimed in claim 1, wherein the source terminal of the first NMOS transistor is connected with a body terminal of the first NMOS transistor, and the source terminal of the third NMOS transistor is connected with a body terminal of the third NMOS transistor.

6. The bandgap reference circuit as claimed in claim 1, wherein a body terminal of the first NMOS transistor is connected with the ground terminal, and a body terminal of the third NMOS transistor is connected with the ground terminal.

7. A bandgap reference circuit, comprising:
a mirroring circuit generating a first current, a second current and a third current, wherein the first current flows to a first node, the second current flows to a second node, and the third current flows to an output terminal of the bandgap reference circuit;
an input circuit connected with the first node to receive the first current and connected with the second node to receive the second current; and
an operation amplifier, wherein a positive input terminal of the operation amplifier is connected with the first node, a negative input terminal of the operation amplifier is connected with the second node, and an output terminal of the operation amplifier is connected with the mirroring circuit, wherein the operation amplifier comprises:
a first PMOS transistor, wherein a source terminal of the first PMOS transistor receives a power supply voltage;
a second PMOS transistor, wherein a source terminal of the second PMOS transistor is connected with a drain terminal of the first PMOS transistor, and a gate terminal of the second PMOS transistor receives a first bias voltage;
a first NMOS transistor, wherein a drain terminal of the first NMOS transistor is connected with a drain terminal of the second PMOS transistor and a gate terminal of the first PMOS transistor, and a gate terminal of the first NMOS transistor receives a second bias voltage;
a second NMOS transistor, wherein a drain terminal of the second NMOS transistor is connected with a source terminal of the first NMOS transistor, a gate terminal of the second NMOS transistor receives a third bias voltage, and a source terminal of the second NMOS transistor is connected with a ground terminal;
a third PMOS transistor, wherein a source terminal of the third PMOS transistor receives the power supply voltage, and a gate terminal of the third PMOS transistor is connected with the gate terminal of the first PMOS transistor;
a fourth PMOS transistor, wherein a source terminal of the fourth PMOS transistor is connected with a drain terminal of the third PMOS transistor, a gate terminal of the fourth PMOS transistor receives the first bias voltage, and a drain terminal of the fourth PMOS transistor is the output terminal of the operation amplifier;
a third NMOS transistor, wherein a drain terminal of the third NMOS transistor is connected with the drain terminal of the fourth PMOS transistor, and a gate terminal of the third NMOS transistor receives the second bias voltage;

a fourth NMOS transistor, wherein a drain terminal of the fourth NMOS transistor is connected with a source terminal of the third NMOS transistor, a gate terminal of the fourth NMOS transistor receives the third bias voltage, and a source terminal of the fourth NMOS transistor is connected with the ground terminal;

a fifth NMOS transistor, wherein a drain terminal of the fifth NMOS transistor is connected with the drain terminal of the first PMOS transistor, and a gate terminal of the fifth NMOS transistor is the positive input terminal of the operation amplifier;

a sixth NMOS transistor, wherein a drain terminal of the sixth NMOS transistor is connected with the drain terminal of the third PMOS transistor, and a gate terminal of the sixth NMOS transistor is the negative input terminal of the operation amplifier; and a reference current source, wherein a first terminal of the reference current source is connected with a source terminal of the fifth NMOS transistor and a source terminal of the sixth NMOS transistor, and a second terminal of the reference current source is connected with the ground terminal.

8. The bandgap reference circuit as claimed in claim 7, wherein the mirroring circuit comprises:

a fifth PMOS transistor, wherein a source terminal of the fifth PMOS transistor receives the power supply voltage, and a gate terminal of the fifth PMOS transistor is connected with the output terminal of the operation amplifier;

a sixth PMOS transistor, wherein a source terminal of the sixth PMOS transistor receives the power supply voltage, and a gate terminal of the sixth PMOS transistor is connected with the output terminal of the operation amplifier;

a seventh PMOS transistor, wherein a source terminal of the seventh PMOS transistor receives the power supply voltage, and a gate terminal of the seventh PMOS transistor is connected with the output terminal of the operation amplifier;

an eighth PMOS transistor, wherein a source terminal of the eighth PMOS transistor is connected with a drain terminal of the fifth PMOS transistor, a gate terminal of the eighth PMOS transistor receives a fourth bias voltage, and a drain terminal of the eighth PMOS transistor is connected with the first node;

a ninth PMOS transistor, wherein a source terminal of the ninth PMOS transistor is connected with a drain terminal of the sixth PMOS transistor, a gate terminal of the ninth PMOS transistor receives the fourth bias voltage, and a drain terminal of the ninth PMOS transistor is connected with the second node; and a tenth PMOS transistor, wherein a source terminal of the tenth PMOS transistor is connected with a drain terminal of the seventh PMOS transistor, a gate terminal of the tenth PMOS transistor receives the fourth bias voltage, and a drain terminal of the tenth PMOS transistor is connected with the output terminal of the bandgap reference circuit.

9. The bandgap reference circuit as claimed in claim 8, wherein the input circuit comprises:

a first resistor;

a first bipolar junction transistor, wherein the first resistor is connected between an emitter of the first bipolar junction transistor and the second node, and a base and a collector of the first bipolar junction transistor are connected with the ground terminal; and a second bipolar junction transistor, wherein an emitter of the second bipolar junction transistor is connected with the first node, and a base and a collector of the second bipolar junction transistor are connected with the ground terminal.

10. The bandgap reference circuit as claimed in claim 9, further comprising:

a second resistor, wherein a first terminal of the second resistor is connected with the output terminal of the bandgap reference circuit; and a third bipolar junction transistor, wherein an emitter of the third bipolar junction transistor is connected with a second terminal of the second resistor, and a base and a collector of the third bipolar junction transistor are connected with the ground terminal.

11. The bandgap reference circuit as claimed in claim 7, wherein the source terminal of the first NMOS transistor is connected with a body terminal of the first NMOS transistor, and the source terminal of the third NMOS transistor is connected with a body terminal of the third NMOS transistor.

12. The bandgap reference circuit as claimed in claim 7, wherein a body terminal of the first NMOS transistor is connected with the ground terminal, and a body terminal of the third NMOS transistor is connected with the ground terminal.

* * * * *